United States Patent
Kuo et al.

(10) Patent No.: US 12,369,371 B2
(45) Date of Patent: Jul. 22, 2025

(54) HIGH ELECTRON MOBILITY TRANSISTOR AND METHOD FOR FABRICATING THE SAME

(71) Applicant: UNITED MICROELECTRONICS CORP., Hsin-Chu (TW)

(72) Inventors: Chun-Liang Kuo, Kaohsiung (TW); Yen-Hsing Chen, Taipei (TW); Yen-Lun Chen, Miaoli County (TW); Ruei-Hong Shen, Hsinchu (TW); Tsung-Mu Yang, Tainan (TW); Yu-Ren Wang, Tainan (TW)

(73) Assignee: UNITED MICROELECTRONICS CORP., Hsin-Chu (TW)

( * ) Notice: Subject to any disclaimer, the term of this patent is extended or adjusted under 35 U.S.C. 154(b) by 409 days.

(21) Appl. No.: 17/896,096

(22) Filed: Aug. 26, 2022

(65) Prior Publication Data
US 2024/0038844 A1    Feb. 1, 2024

(51) Int. Cl.
*H10D 62/17*    (2025.01)
*H10D 30/01*    (2025.01)
(Continued)

(52) U.S. Cl.
CPC ......... *H10D 62/235* (2025.01); *H10D 30/015* (2025.01); *H10D 30/475* (2025.01)

(58) Field of Classification Search
CPC ........... H01L 29/66462; H01L 29/7786; H01L 29/1029; H01L 29/778; H01L 29/207; H01L 29/36; H01L 29/06; H01L 29/0684; H10D 62/235; H10D 30/015; H10D 30/475; H10D 30/47; H10D 62/221; H10D 62/60; H10D 62/854; H10D 62/8503; H10D 62/343
See application file for complete search history.

(56) References Cited

U.S. PATENT DOCUMENTS 9,166,031 B2    10/2015  Kotani et al.
9,608,075 B1 *   3/2017  Wan ................ H01L 21/02581
(Continued)

FOREIGN PATENT DOCUMENTS

| CN | 109524455 A | 3/2019 | |
|---|---|---|---|
| TW | 202017187 | 5/2020 | |
| WO | WO-2007097264 A1 * | 8/2007 | ......... H01L 29/7787 |

OTHER PUBLICATIONS

Sebastian Gustafsson et al., Dispersive Effects in Microwave AlGaN/AlN/GaN HEMTs With Carbon-Doped Buffer, IEEE Transactions on Electron Devices, Jul. 2015, pp. 2162-2169, vol. 62, No. 7.

*Primary Examiner* — Sonya McCall-Shepard
(74) *Attorney, Agent, or Firm* — Winston Hsu

(57) ABSTRACT

A method for fabricating a high electron mobility transistor (HEMT) includes the steps of forming a buffer layer on a substrate, forming a barrier layer on the buffer layer, forming a p-type semiconductor layer on the barrier layer, forming a gate electrode on the p-type semiconductor layer, and then forming a source electrode and a drain electrode adjacent to two sides of the gate electrode. Preferably, the buffer layer further includes a bottom portion having a first carbon concentration and a top portion having a second carbon concentration, in which the second carbon concentration is less than the first carbon concentration and a thickness of the bottom portion is less than a thickness of the top portion.

6 Claims, 2 Drawing Sheets

(51) Int. Cl.
*H10D 30/47* (2025.01)
*H10D 62/10* (2025.01)
*H10D 62/60* (2025.01)
*H10D 62/85* (2025.01)
*H10D 62/854* (2025.01)

(56) References Cited

U.S. PATENT DOCUMENTS

| | | |
|---|---|---|
| 10,186,588 B1 | 1/2019 | Kato |
| 2013/0240901 A1* | 9/2013 | Kohda ................. H10D 30/015 257/76 |
| 2014/0264441 A1 | 9/2014 | Murase |
| 2016/0240679 A1* | 8/2016 | Chen ................... H01L 21/0254 |
| 2017/0271454 A1* | 9/2017 | Prechtl ............. H01L 21/02579 |
| 2020/0251563 A1* | 8/2020 | Jiang ..................... H01L 29/402 |
| 2021/0057561 A1* | 2/2021 | Hsieh ................. H10D 62/8164 |

* cited by examiner

HIGH ELECTRON MOBILITY TRANSISTOR AND METHOD FOR FABRICATING THE SAME

BACKGROUND OF THE INVENTION

1. Field of the Invention

The invention relates to a high electron mobility transistor (HEMT) and fabrication method thereof.

2. Description of the Prior Art

High electron mobility transistor (HEMT) fabricated from GaN-based materials have various advantages in electrical, mechanical, and chemical aspects of the field. For instance, advantages including wide band gap, high break down voltage, high electron mobility, high elastic modulus, high piezoelectric and piezoresistive coefficients, and chemical inertness. All of these advantages allow GaN-based materials to be used in numerous applications including high intensity light emitting diodes (LEDs), power switching devices, regulators, battery protectors, display panel drivers, and communication devices.

SUMMARY OF THE INVENTION

According to an embodiment of the present invention, a method for fabricating a high electron mobility transistor (HEMT) includes the steps of forming a buffer layer on a substrate, forming a barrier layer on the buffer layer, forming a p-type semiconductor layer on the barrier layer, forming a gate electrode on the p-type semiconductor layer, and then forming a source electrode and a drain electrode adjacent to two sides of the gate electrode. Preferably, the buffer layer further includes a bottom portion having a first carbon concentration and a top portion having a second carbon concentration, in which the second carbon concentration is less than the first carbon concentration and a thickness of the bottom portion is less than a thickness of the top portion.

According to another aspect of the present invention, a high electron mobility transistor (HEMT) includes a buffer layer on a substrate and a barrier layer on the buffer layer. Preferably, the buffer layer includes a bottom portion having a first carbon concentration and a top portion having a second carbon concentration.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
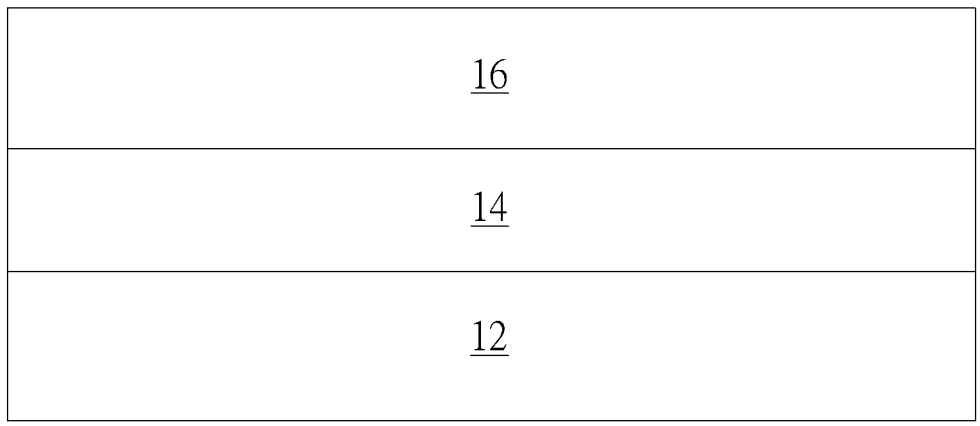
FIGS. 1-3 illustrate a method for fabricating a HEMT according to an embodiment of the present invention.
Figure 2:
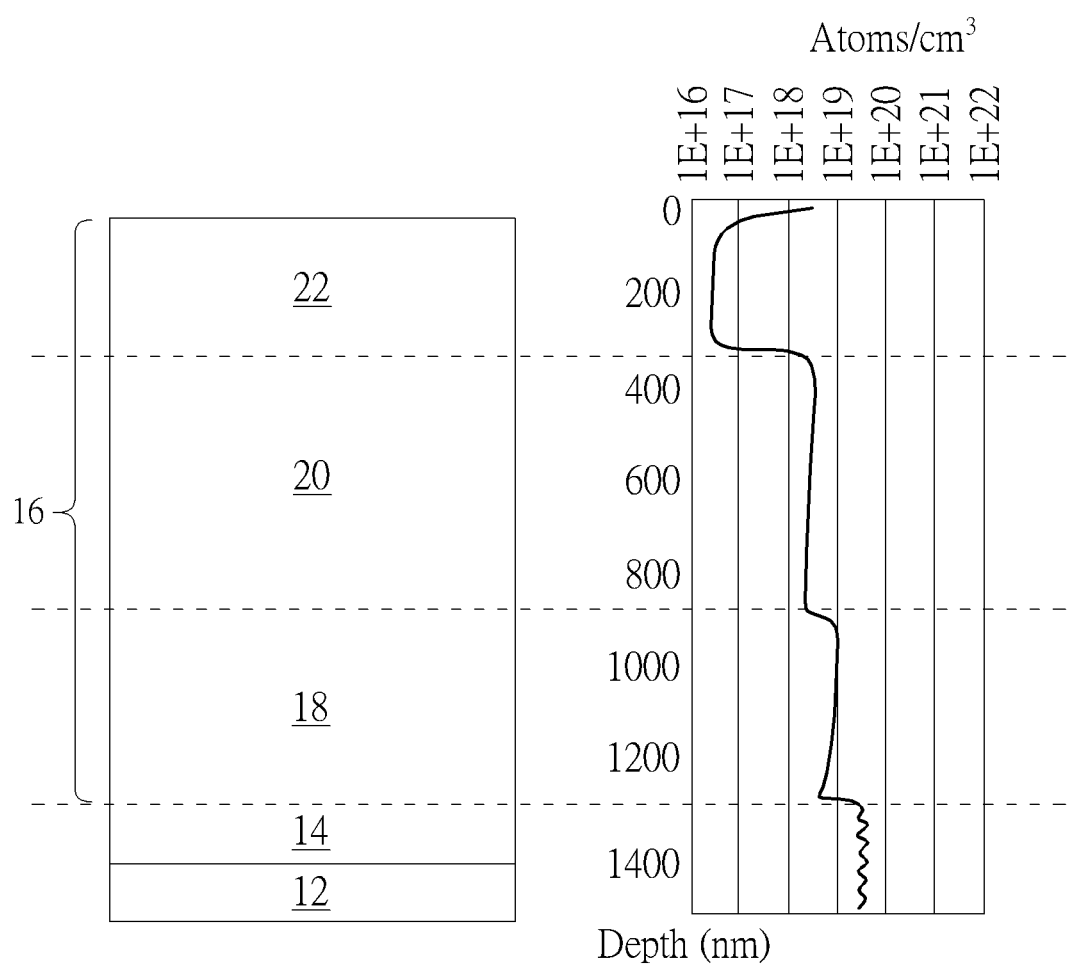
Figure 3:
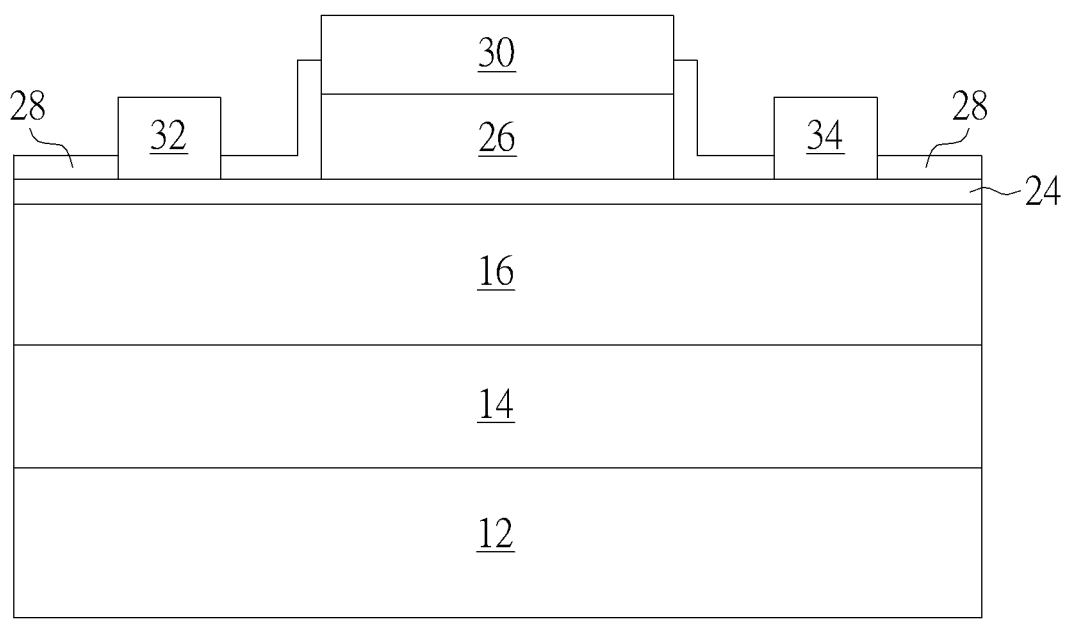

Referring to FIGS. 1-3, FIGS. 1-3 illustrate a method for fabricating a HEMT according to an embodiment of the present invention. As shown in FIG. 1, a substrate 12 such as a substrate made from silicon, silicon carbide, or aluminum oxide (or also referred to as sapphire) is provided, in which the substrate 12 could be a single-layered substrate, a multi-layered substrate, gradient substrate, or combination thereof. According to other embodiment of the present invention, the substrate 12 could also include a silicon-on-insulator (SOI) substrate.

Next, a selective nucleation layer (not shown), a superlattice stack layer 14, and a buffer layer 16 are formed on the substrate 12. According to an embodiment of the present invention, the nucleation layer preferably includes aluminum nitride (AlN), the superlattice stack layer 14 includes a composite layer made of alternating AlN and $Al_xGa_{1-x}N$, and the buffer layer 16 is preferably made of III-V semiconductors such as gallium nitride (GaN), in which a thickness of the buffer layer 16 could be between 0.5 microns to 10 microns. According to an embodiment of the present invention, the formation of the superlattice stack layer 14 and the buffer layer 16 on the substrate 12 could be accomplished by a molecular-beam epitaxy (MBE) process, a metal organic chemical vapor deposition (MOCVD) process, a chemical vapor deposition (CVD) process, a hydride vapor phase epitaxy (HVPE) process, or combination thereof.

As shown in FIG. 2, the buffer layer 16 from bottom to top includes a bottom portion 18, a top portion 20, and a channel region 22, in which the bottom portion 18, the top portion 20, and the channel region 22 are essentially made of GaN while the bottom portion 18 and the top portion 20 are doped with higher concentration of carbon atoms whereas the channel region 22 is doped with lower concentration of carbon atoms or not doped at all (undoped). The thickness of the bottom portion 18 is also slightly less than the thickness of the top portion 20.

It should be noted that the carbon concentration of the bottom portion 18 is preferably different from or more specifically greater than the carbon concentration of the top portion 20 and the carbon concentration of the channel region 22 is less than the carbon concentration of the bottom portion 18 and the top portion 20. Specifically, the bottom portion 18 includes a first carbon concentration, the top portion 20 includes a second carbon concentration, and the channel region 22 includes a third carbon concentration, in which the third carbon concentration of the channel region 22 is less than the second carbon concentration of the top portion 20 and the first carbon concentration of the bottom portion 18 while the second carbon concentration of the top portion 20 is also less than the first carbon concentration of the bottom portion 18. In other words, the first carbon concentration is greater than the second carbon concentration and both the first carbon concentration and second carbon concentration are greater than the third carbon concentration. According to an embodiment of the present invention, the first carbon concentration is between $5.0 \times 10^{18}$ atoms/cm$^3$ to $1.0 \times 10^{19}$ atoms/cm$^3$, the second carbon concentration is between $1.0 \times 10^{18}$ atoms/cm$^3$ to $4.0 \times 10^{18}$ atoms/cm$^3$, and the third carbon concentration is between $1.0 \times 10^{16}$ atoms/cm$^3$ to $1.0 \times 10^{17}$ atoms/cm$^3$.

Next, as shown in FIG. 3, a barrier layer 24 is formed on the surface of the buffer layer 16 or UID buffer layer. In this embodiment, the barrier layer 24 is preferably made of III-V semiconductor such as n-type or n-graded aluminum gallium nitride ($Al_xGa_{1-x}N$), in which 0<x<1, the barrier layer 24 preferably includes an epitaxial layer formed through epitaxial growth process, and the barrier layer 24 could include dopants such as silicon or germanium. Similar to the buffer layer 16, the formation of the barrier layer 24 could be accomplished by a molecular-beam epitaxy (MBE) process, a metal organic chemical vapor deposition (MOCVD) process, a chemical vapor deposition (CVD) process, a hydride vapor phase epitaxy (HVPE) process, or combination thereof.

Next, a p-type semiconductor layer 26 is formed on the barrier layer 24, a passivation layer 28 is formed on the barrier layer 24 and the p-type semiconductor layer 26, a gate electrode is formed on the p-type semiconductor layer 26, and a source electrode 32 and a drain electrode 34 are formed adjacent to two sides of the gate electrode 30, in which the p-type semiconductor layer 26 and the gate electrode 30 could constitute a gate structure altogether. In this embodiment, the p-type semiconductor layer 26 is a III-V compound semiconductor layer preferably including p-type GaN (pGaN) and the formation of the p-type semiconductor layer 26 on the barrier layer 24 could be accomplished by a molecular-beam epitaxy (MBE) process, a metal organic chemical vapor deposition (MOCVD) process, a chemical vapor deposition (CVD) process, a hydride vapor phase epitaxy (HVPE) process, or combination thereof.

According to an embodiment of the present invention, it would be desirable to first form a p-type semiconductor layer 26 on the barrier layer 24 and then conduct a photo-etching process to remove part of the p-type semiconductor layer 26 for forming a patterned p-type semiconductor layer 26. After depositing a passivation layer 28 on the patterned p-type semiconductor layer 26 and the barrier layer 24, a photo-etching process could be conducted to remove part of the passivation layer 28 for forming a recess (not shown), a gate electrode 30 is formed in the recess directly on the p-type semiconductor layer 26, another photo-etching process is conducted to remove part of the passivation layer 28 adjacent to two sides of the p-type semiconductor layer 26 for forming additional recesses (not shown), and then a source electrode 32 and a drain electrode 34 are formed in the recesses adjacent to two sides of the gate electrode 30.

In this embodiment, the gate electrode 30, the source electrode 32, and the drain electrode 34 are preferably made of metal, in which the gate electrode 30 is preferably made of Schottky metal while the source electrode 32 and the drain electrode 34 are preferably made of ohmic contact metals. According to an embodiment of the present invention, each of the gate electrode 30, source electrode 32, and drain electrode 34 could include gold (Au), Silver (Ag), platinum (Pt), titanium (Ti), aluminum (Al), tungsten (W), palladium (Pd), or combination thereof. Preferably, it would be desirable to conduct an electroplating process, sputtering process, resistance heating evaporation process, electron beam evaporation process, physical vapor deposition (PVD) process, chemical vapor deposition (CVD) process, or combination thereof to form electrode materials in the aforementioned openings, and then pattern the electrode materials through one or more etching processes to form the gate electrode 30, source electrode 32, and the drain electrode 34. This completes the fabrication of a HEMT according to an embodiment of the present invention.

Typically, a heterojunction is formed at the interface between the buffer layer 16 and barrier layer 24 as a result of the bandgap difference between the two layers. Essentially a quantum well is formed in the banding portion of the conduction band of the heterojunction to constrain the electrons generated by piezoelectricity so that a channel region or two-dimensional electron gas (2DEG) is formed at the junction between the buffer layer and barrier layer to form conductive current.

However in current design of the buffer layer, the corresponding top portion such as the top portion 20 of the buffer layer is also made of GaN doped with carbon atoms while the bottom portion 18 of the buffer layer is made of undoped GaN or GaN having no dopants whatsoever. Since the GaN buffer layer having no dopants typically has lower potential well, electrons in the channel region are more likely to be injected into deeper or bottom portion 18 of the buffer layer to initiate a discharge effect thereby lowering 2DEG and increasing resistance.

To resolve this issue the present adjusts the carbon concentrations of the bottom portion 18 and top portion 20 of the buffer layer so that the carbon concentration of the bottom portion 18 is slightly higher than the carbon concentration of the top portion 20. By creating a step-profile increase of carbon concentration from the top portion 20 to the bottom portion 18, it would be desirable to inhibit the formation of potential well and prevent carriers from entering the lower level or bottom portion 20 of the buffer layer thereby lowering discharge of the device.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A method for fabricating a high electron mobility transistor (HEMT), comprising:
    forming a superlattice stack layer on a substrate, wherein the superlattice stack layer comprises a composite layer made of alternating AlN and $Al_xGa_{1-x}N$;
    forming a buffer layer on the substrate, wherein the buffer layer comprises:
        a bottom portion directly formed on the superlattice stack layer and having a first carbon concentration; and
        a top portion being contiguous with the bottom portion and having a second carbon concentration different from the first carbon concentration;
    forming a channel layer directly on the top portion, the channel layer having a third carbon concentration; and
    forming a barrier layer directly on the channel layer,
    wherein a thickness of the bottom portion is less than a thickness of the top portion,
    wherein the bottom portion, the top portion and the channel layer comprises gallium nitride, GaN, and the barrier layer comprises $Al_xGa_{1-x}N$, and
    wherein the third carbon concentration is less than the second carbon concentration, the third carbon concentration is less than the first carbon concentration, and the second carbon concentration is less than the first carbon concentration.

2. The method of claim 1, further comprising:
    forming a p-type semiconductor layer on the barrier layer;
    forming a gate electrode on the p-type semiconductor layer; and
    forming a source electrode and a drain electrode adjacent to two sides of the gate electrode.

3. The method of claim 2, wherein the p-type semiconductor layer comprises p-type gallium nitride (pGaN).

4. A high electron mobility transistor (HEMT), comprising:
    a superlattice stack layer on a substrate, wherein the superlattice stack layer comprises a composite layer made of alternating $Al_xGa_{1-x}N$;
    a buffer layer on the substrate, wherein the buffer layer comprises:
        a bottom portion directly formed on the superlattice stack layer and having a first carbon concentration;

a top portion being contiguous with the bottom portion and having a second carbon concentration different from the first carbon concentration;

a channel layer formed directly on the top portion and having a third carbon concentration; and a barrier layer formed directly on the channel layer, wherein a thickness of the bottom portion is less than a thickness of the top portion, wherein the bottom portion, the top portion and the channel layer comprises gallium nitride, GaN, and the barrier layer comprises $Al_xGa_{1-x}N$, and wherein the third carbon concentration is less than the second carbon concentration, the third carbon concentration is less than the first carbon concentration, and the second carbon concentration is less than the first carbon concentration.

5. The HEMT of claim 4, further comprising:

a p-type semiconductor layer on the barrier layer;

a gate electrode on the p-type semiconductor layer; and a source electrode and a drain electrode adjacent to two sides of the gate electrode.

6. The HEMT of claim 5, wherein the p-type semiconductor layer comprises p-type gallium nitride (pGaN).

* * * * *

UNITED STATES PATENT AND TRADEMARK OFFICE
CERTIFICATE OF CORRECTION

Page 1 of 1

PATENT NO. : 12,369,371 B2
APPLICATION NO. : 17/896096
DATED : July 22, 2025
INVENTOR(S) : Chun-Liang Kuo et al.

It is certified that error appears in the above-identified patent and that said Letters Patent is hereby corrected as shown below:

On the Title Page

Add:
--(30) Foreign Application Priority Data
Jul. 27, 2022 (TW) ................ 111128095--.

Signed and Sealed this
Third Day of February, 2026

John A. Squires
*Director of the United States Patent and Trademark Office*